(12) United States Patent
Tan

(10) Patent No.: US 8,504,604 B2
(45) Date of Patent: Aug. 6, 2013

(54) MULTIMETER WITH FILTERED MEASUREMENT MODE

(75) Inventor: Po-Chao Tan, Chung-Ho (TW)

(73) Assignee: Brymen Technology Corporation, New Taipei (TW)

( * ) Notice: Subject to any disclaimer, the term of this patent is extended or adjusted under 35 U.S.C. 154(b) by 660 days.

(21) Appl. No.: 12/616,884

(22) Filed: Nov. 12, 2009

(65) Prior Publication Data

US 2011/0087719 A1 Apr. 14, 2011

(30) Foreign Application Priority Data

Oct. 9, 2009 (TW) .............................. 98218609 U

(51) Int. Cl.
*G06F 7/52* (2006.01)
*G01R 1/38* (2006.01)

(52) U.S. Cl.
USPC .............................. 708/606; 324/67; 324/115

(58) Field of Classification Search
USPC ......................................................... 708/606
See application file for complete search history.

(56) References Cited

U.S. PATENT DOCUMENTS

| | | | |
|---|---|---|---|
| 4,941,267 A * | 7/1990 | Miller, Jr. ........................ 33/700 |
| 7,034,517 B2 | 4/2006 | Newcombe | |
| 7,342,393 B2 | 3/2008 | Newcombe | |
| 2005/0200348 A1* | 9/2005 | Newcombe ................. 324/99 D |
| 2008/0194926 A1* | 8/2008 | Goh et al. ...................... 600/301 |
| 2009/0045825 A1* | 2/2009 | Eng, Jr. .......................... 324/713 |
| 2010/0326804 A1* | 12/2010 | Saur ........................... 200/332.2 |

OTHER PUBLICATIONS

European research report.

* cited by examiner

*Primary Examiner* — Henry Tsai
*Assistant Examiner* — Dean Phan
(74) *Attorney, Agent, or Firm* — Chun-Ming Shih; HDLS IPR Services

(57) ABSTRACT

A multimeter with filtered measurement mode is disclosed. The multimeter includes a signal conditioning circuit, a low-pass filter, a microprocessor, a measurement circuit, a root-mean-square (RMS) converter, a display unit, and an external rotary switch. The signal conditioning circuit receives a control signal to select an operation mode of the multimeter. The low-pass filter is electrically connected to the signal conditioning circuit. The microprocessor is electrically connected to the signal conditioning circuit. The measurement circuit is electrically connected to the microprocessor and the RMS converter to measure a signal outputted from the RMS converter. The display unit is electrically connected to the microprocessor and the measurement circuit. Also, the external rotary switch is optionally connected to the microprocessor. Whereby rotating the external rotary switch to generate the control signal and perform a low-pass filtering mode to communicate the low-pass filter with the RMS converter.

1 Claim, 4 Drawing Sheets

MULTIMETER WITH FILTERED MEASUREMENT MODE

BACKGROUND OF THE INVENTION

1. Field of the Invention

The present invention relates to a multimeter, and more particularly to a multimeter with a filtered measurement mode.

2. Description of Prior Art

Digital multimeters measure a wide range of electrical parameters, such as AC and DC currents and voltages, and resistance.

However, there are a number of measurement situations confronting the technician in which it is extremely difficult to make accurate measurements. For example, 1. adjustable speed motor drives;
2. uninterruptible power sources; and
3. switching power supplies use pulse-width modulation using high frequency and high voltage pulses to generate pulse-width modulated pulses, or lower frequency sinusoidal signals.

However, the measured root-mean-square (RMS) voltage value is substantially larger than the actual RMS voltage value to cause significant distortion because the measured RMS voltage value contains the high-frequency component, which is caused from factors such as voltage spikes, noise, and switching transients. Hence, a low-pass filter, installed in the multimeter, is used to filter out unnecessary high-frequency component of the voltage signal to acquire correct RMS voltage value.

The U.S. Pat. Nos. 7,342,393 and 7,034,517 both disclosed a multimeter with a filtered measurement mode, and the multimeter has the above-motioned low-pass filtering function to filter out unnecessary high-frequency component of the voltage signal to acquire correct RMS voltage value. However, the disclosed multimeter has a single button on the panel to select an operation of low-pass filtering mode. Also, users can recognize that the low-pass filtering mode is operated while a symbol of using a low-pass filtering mode, such as "LO", is shown on a view screen of the multimeter. The low-pass filtering mode is canceled and the symbol "LO" is not shown when the single button is pressed again. However, such operation is not simple and convenient.

In practically, users have to carefully check whether the symbol "LO" is shown or not before operating the low-pass filtering mode in order to avoid misemploying the multimeter to acquire unwanted measured results.

SUMMARY OF THE INVENTION

In order to improve the disadvantages mentioned above, the prevent invention provides a multimeter with a filtered measurement mode.

In order to achieve an objective mentioned above, the multimeter with a filtered measurement mode includes a signal conditioning circuit, a low-pass filter, a microprocessor, a measurement circuit, a root-mean-square (RMS) converter, a display unit, and an external rotary switch. The signal conditioning circuit receives a control signal to select an operation mode of the multimeter. The low-pass filter is electrically connected to the signal conditioning circuit. The microprocessor is electrically connected to the signal conditioning circuit. The measurement circuit is electrically connected to the microprocessor and the RMS converter to measure a signal outputted from the RMS converter. The display unit is electrically connected to the microprocessor and the measurement circuit. Also, the external rotary switch is optionally connected to the microprocessor. Whereby rotating the external rotary switch to generate the control signal and perform a low-pass filtering mode to communicate the low-pass filter with the RMS converter.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF DRAWING

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DETAILED DESCRIPTION OF THE INVENTION

In cooperation with attached drawings, the technical contents and detailed description of the present invention are described thereinafter according to a preferable embodiment, being not used to limit its executing scope. Any equivalent variation and modification made according to appended claims is all covered by the claims claimed by the present invention.

Figure 1:
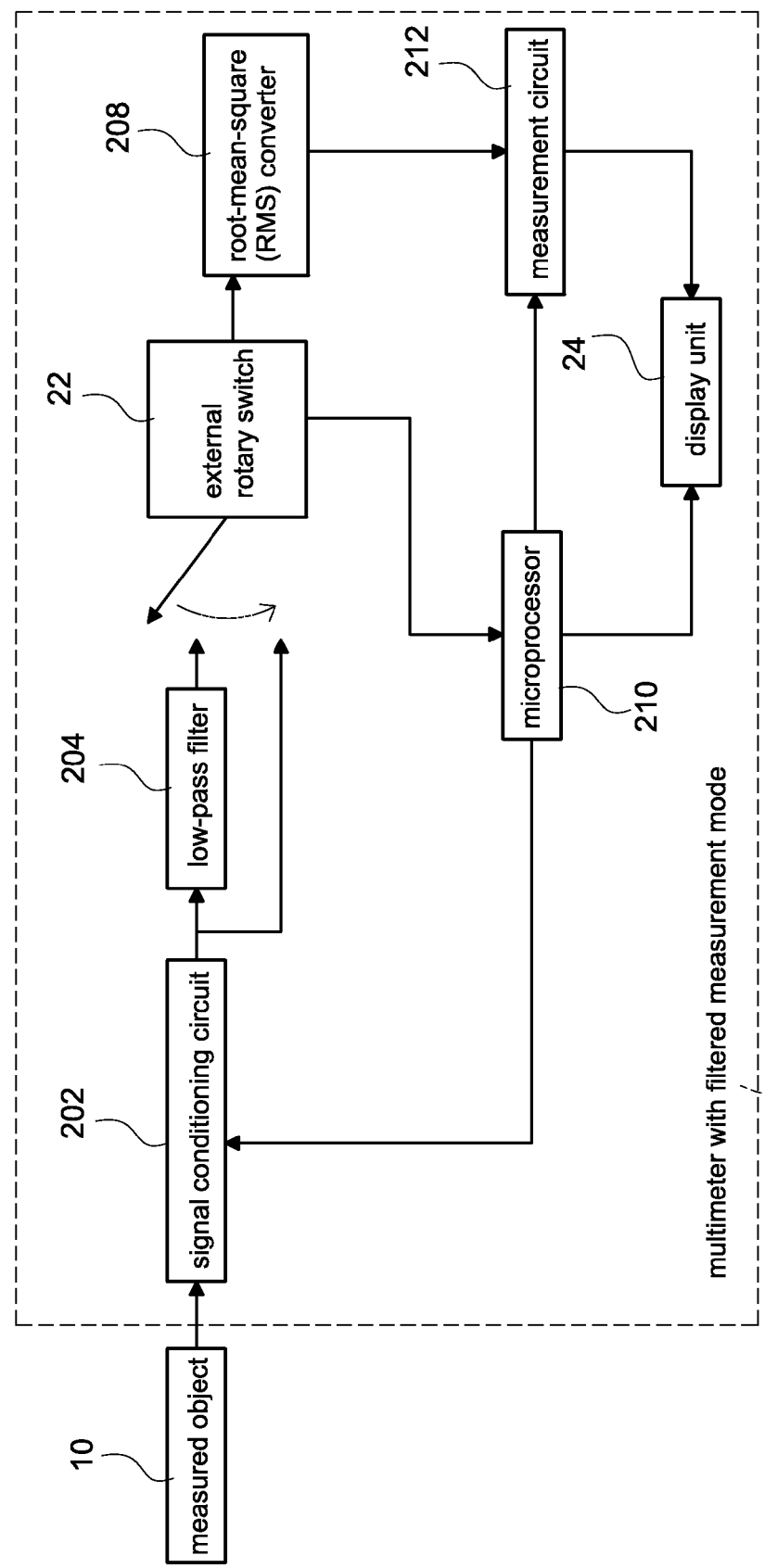
FIG. 1 is a block diagram of a first embodiment of a multimeter with a filtered measurement mode according to the present invention.

Reference will now be made to the drawing figures to describe the present invention in detail. Reference is made to FIG. 1 which is a block diagram of a first embodiment of a multimeter with a filtered measurement mode according to the present invention. The multimeter with a filtered measurement mode 20 is applied to a measured object 10. The multimeter with a filtered measurement mode 20 includes a signal conditioning circuit 202, a low-pass filter 204, a microprocessor 210, a measurement circuit 212, a root-mean-square (RMS) converter 208, a display unit 24, and an external rotary switch 22.

The low-pass filter 204 is electrically connected to the signal conditioning circuit 202. The microprocessor 210 is electrically connected to the signal conditioning circuit 202. The measurement circuit 212 is electrically connected to the microprocessor 210 and the RMS converter 208. The display unit 24 is electrically connected to the microprocessor 210 and the measurement circuit 212. Also, the external rotary switch 22 is optionally connected to the microprocessor 210.

Figure 4:
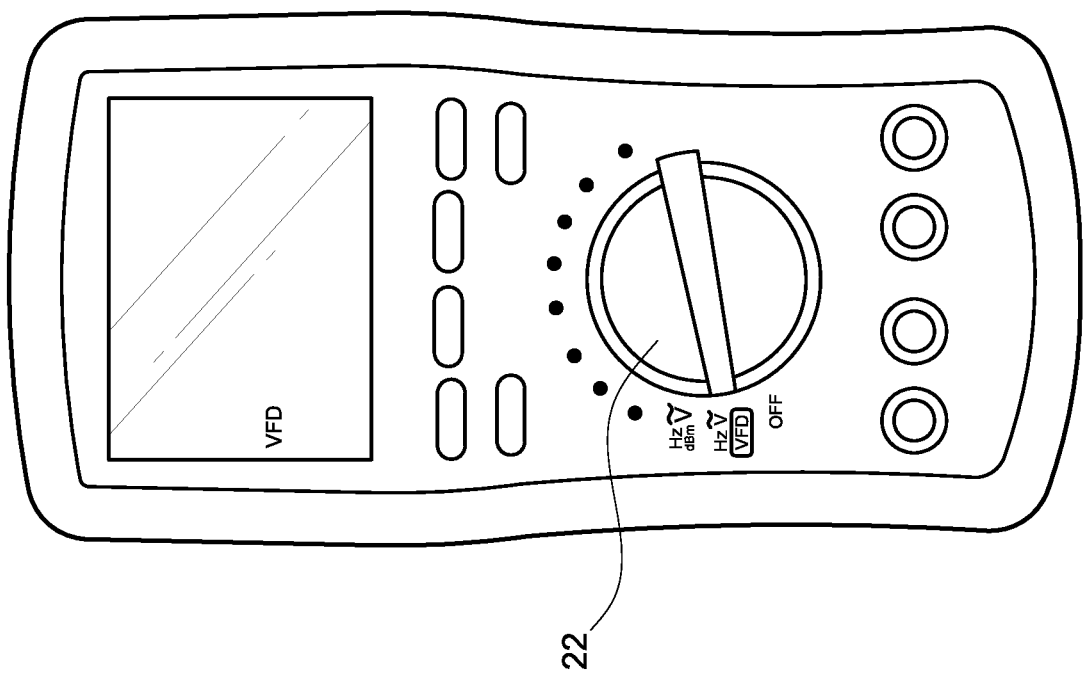
FIG. 4 is a front view of the multimeter with the filtered measurement.

The signal conditioning circuit 202 receives a control signal to select an operation mode of the multimeter with a filtered measurement mode 20. The operation mode includes measuring AC (or DC) currents, voltages, resistance, and so on. The measurement circuit 212 is used to measure a signal outputted from the RMS converter 208. By rotating the external rotary switch 22 to generate the control signal, which is generated by the microprocessor 210, to perform a low-pass filtering mode to communicate the low-pass filter 204 with the RMS converter 208. Reference is made to FIG. 4 which is a front view of the multimeter with the filtered measurement. The external rotary switch 22 is rotated to the low-pass filtering mode (namely, the VFD range is selected as shown in FIG. 4) to communicate the low-pass filter 204 with the RMS converter 208.

Figure 2:
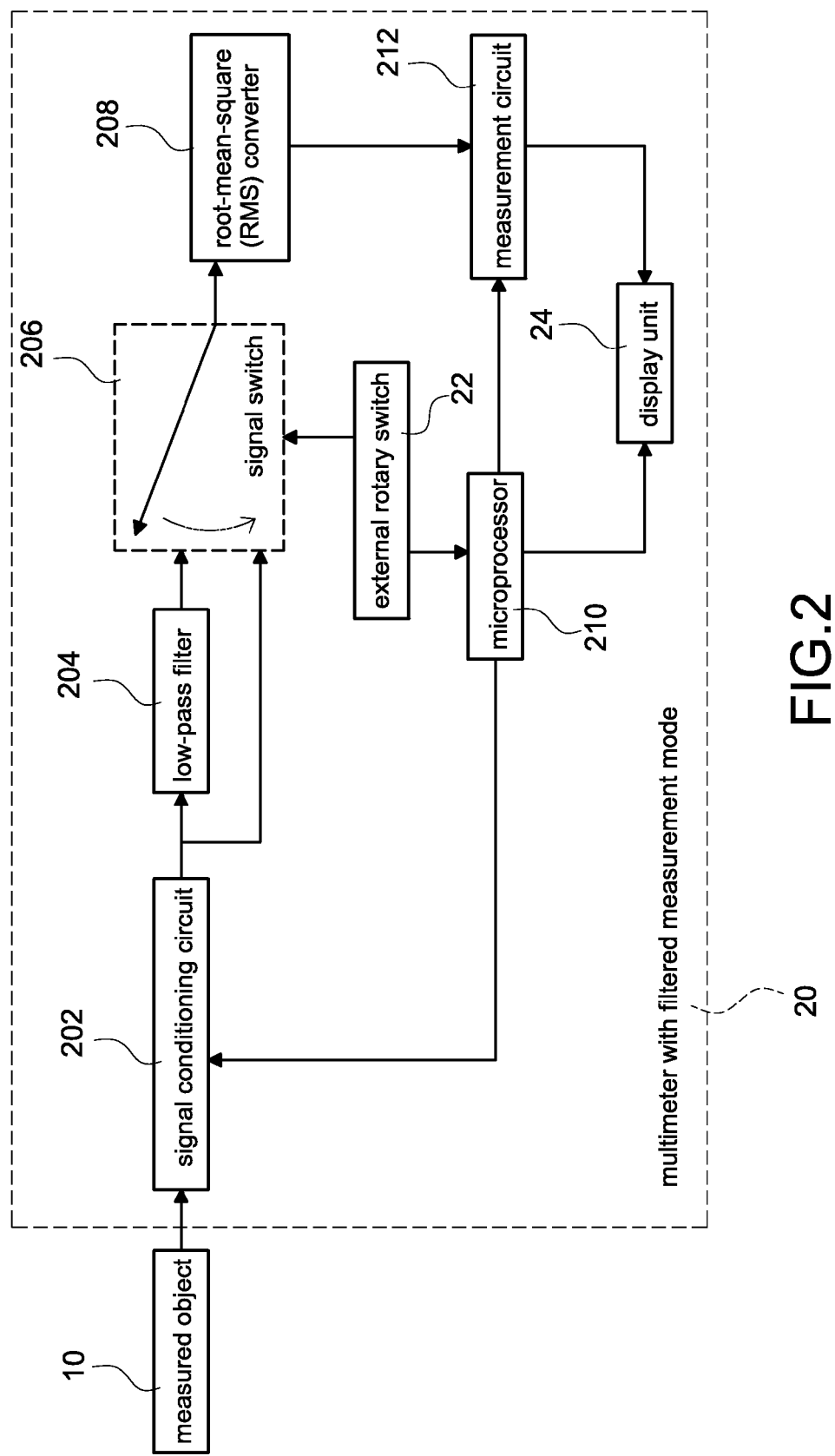
FIG. 2 is a block diagram of a second embodiment of the multimeter with the filtered measurement mode.

Reference is made to FIG. 2, which is a block diagram of a second embodiment of the multimeter with the filtered measurement mode. The connection relationship of the components of the second embodiment is similar to that of the first embodiment. The main difference between the second embodiment and the first embodiment is that: the second embodiment further includes a signal switch 206, which is optionally connected to the external rotary switch 22. By rotating the external rotary switch 22, the signal switch 206 is switched to perform a low-pass filtering mode to communicate the low-pass filter 204 with the RMS converter 208.

Figure 3:
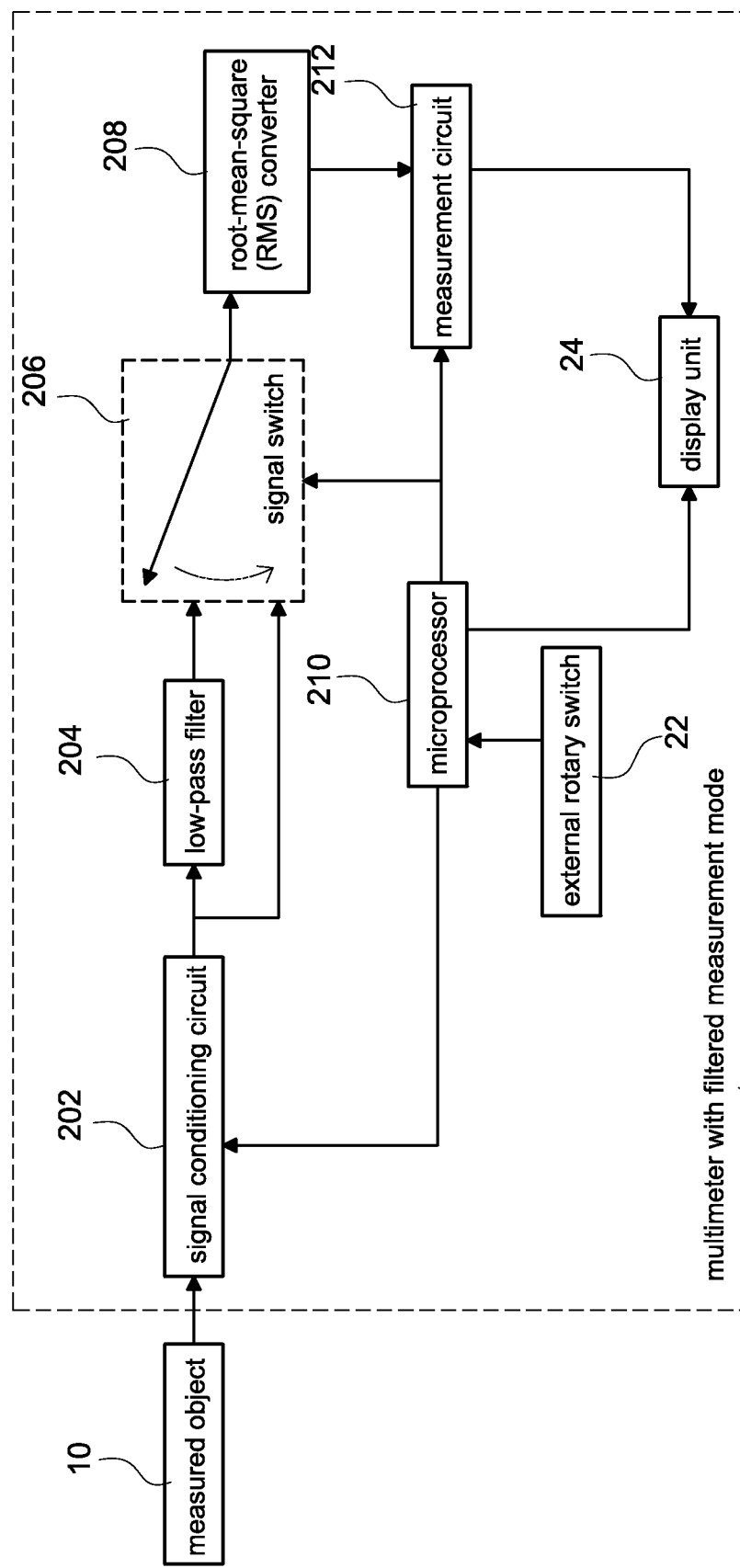
FIG. 3 is a block diagram of a third embodiment of the multimeter with the filtered measurement.

Reference is made to FIG. 3, which is a block diagram of a third embodiment of the multimeter with the filtered measurement. The connection relationship of the components of the third embodiment is similar to that of the first embodiment. The main difference between the third embodiment and the first embodiment is that: the third embodiment further includes a signal switch 206, which is electrically connected to the microprocessor 210. By rotating the external rotary switch 22, the microprocessor 210 controls the signal switch 206 to perform a low-pass filtering mode to communicate the low-pass filter 204 with the RMS converter 208.

In conclusion, the main difference between the first embodiment, the second embodiment, and the third embodiment is that:

1. In the first embodiment, the external rotary switch 22 is directly used to communicate the low-pass filter 204 with the RMS converter 208.

2. In the second embodiment, the external rotary switch 22 is used to control the signal switch 206 to communicate the low-pass filter 204 with the RMS converter 208.

3. In the third embodiment, the external rotary switch 22 is used to control the microprocessor 210, and then the microprocessor 210 controls the signal switch 206 to communicate the low-pass filter 204 with the RMS converter 208.

The multimeter of the present invention is more advantageous than the prior art multimeter is to provide a simple operation. Namely, the external rotary switch 22 is only used to perform a low-pass filtering mode. On condition that the external rotary switch 22 is rotated to the VFD range (low-pass filtering mode is enabled), users can operate the multimeter with a filtered measurement mode 20 to the low-pass filtering mode.

In the above-mentioned embodiments, the display unit 24 does not need to show any symbol to indicate that the external rotary switch 22 is rotated to the low-pass filtering mode.

However, operating the prior art multimeter in a low-pass filtering mode, users have to carefully check whether a symbol of using a low-pass filtering mode is shown on a displayer of the multimeter. Accordingly, users can correctly operate the multimeter to acquire the wanted measured results when users easily confirm that the VFD range (low-pass filtering mode range) is selected.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A multimeter with filtered measurement mode, comprising:
   a signal conditioning circuit to be adapted for connecting with a measured object;
   a low-pass filter electrically connected to the signal conditioning circuit;
   a microprocessor electrically connected to the signal conditioning circuit;
   a root-mean-square (RMS) converter;
   a signal switch electrically connected to the RMS converter;
   a measurement circuit electrically connected to the microprocessor and electrically and directly connected the RMS converter to measure a signal outputted from the RMS converter;
   a display unit electrically connected to the microprocessor and the measurement circuit; and
   an external rotary switch directly connected between the microprocessor and the signal switch, so that when the external rotary switch is rotated to a first position the signal switch is directly controlled by the external rotary switch to electrically connected to the low-pass filter and a control signal generated by the microprocessor is sent to the signal conditioning circuit for performing a filtered measurement mode operation, when the external rotary switch is rotated to a second position the signal switch is directly controlled by the external rotary switch to electrically connected to the signal conditioning circuit and the control signal generated by the microprocessor is sent to the signal conditioning circuit for performing a normal mode operation, and an OFF is selected when the external rotary switch is rotated to a third position.

* * * * *